(12) United States Patent
Tseng

(10) Patent No.: US 11,163,382 B2
(45) Date of Patent: Nov. 2, 2021

(54) MOUSE

(71) Applicant: Cheng Uei Precision Industry Co., LTD., New Taipei (TW)

(72) Inventor: Chi-Ming Tseng, New Taipei (TW)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 17/094,789

(22) Filed: Nov. 10, 2020

(65) Prior Publication Data

US 2021/0208703 A1 Jul. 8, 2021

(30) Foreign Application Priority Data

Jan. 2, 2020 (CN) .......................... 202020001424.0

(51) Int. Cl.
*G06F 3/0354* (2013.01)
*H03K 17/96* (2006.01)

(52) U.S. Cl.
CPC ......... *G06F 3/03543* (2013.01); *H03K 17/96* (2013.01); *H03K 2217/96023* (2013.01)

(58) Field of Classification Search
CPC .............. G06F 3/03543; H03K 17/96; H03K 2217/96023

USPC ......................................................... 345/163
See application file for complete search history.

(56) References Cited

U.S. PATENT DOCUMENTS 10,095,323 B1 * 10/2018 Tseng ...................... G06F 3/023
2020/0333893 A1 * 10/2020 Lin ..................... G06F 3/03543

FOREIGN PATENT DOCUMENTS

CN         109119272 A   *  1/2019
JP         2011222407 A  *  11/2011

* cited by examiner

*Primary Examiner* — Mark Edwards
(74) *Attorney, Agent, or Firm* — Cheng-Ju Chiang

(57) ABSTRACT

A mouse includes a lower shell, an upper shell covered on the lower shell, a circuit board and a pressing button. The upper shell is spaced from the lower shell to form an accommodating space between the lower shell and the upper shell. The upper shell has at least one elastic arm. The circuit board fastened in the accommodating space is equipped with at least one electronic switch corresponding to the at least one elastic arm. The at least one electronic switch has a touching element. The pressing button is covered on the upper shell. The pressing button has at least one touching board which protrudes downward to form at least one pressing block. The at least one elastic arm is received in the at least one pressing block. The at least one pressing block abuts against the touching element.

17 Claims, 10 Drawing Sheets

// MOUSE

CROSS-REFERENCE TO RELATED APPLICATION

The present application is based on, and claims priority from, China Patent Application No. 202020001424.0, filed Jan. 2, 2020, the disclosure of which is hereby incorporated by reference herein in its entirety.

BACKGROUND OF THE INVENTION

1. Field of the Invention

The present invention generally relates to a mouse, and more particularly to a mouse still having a better hand feeling after being used in a long time.

2. The Related Art

As is known to all, a current mouse is a commonly and frequently used computer input device, and the current mouse is operated by a button and a roller device.

However, after the current mouse is used in a long time, a portion of the button contacting an electronic touching element of the current mouse will generate a partial abrasion phenomenon, when a user uses the current mouse, an idle stroke is formed between an abrasion position of the button and the electronic touching element to cause an operation failure of the current mouse or a poor hand feeling of the current mouse. Furthermore, after the current mouse is used in the long time, a dust particle is stuck in a gap of an abrasion position of the current mouse, in this situation, the operation failure of the current mouse or the poor hand feeling of the current mouse is similarly caused.

Thus, it is essential to provide an innovative mouse, the innovative mouse still has a better hand feeling after being used in a long time.

SUMMARY OF THE INVENTION

An object of the present invention is to provide a mouse. The mouse includes a lower shell, an upper shell, a circuit board and a pressing button. The upper shell is covered on the lower shell. A middle of the upper shell is spaced from the lower shell to form an accommodating space between the lower shell and the upper shell. The upper shell has at least one elastic arm. The circuit board is fastened in the accommodating space. A front end of a top surface of the circuit board is equipped with at least one electronic switch. The at least one electronic switch is corresponding to the at least one elastic arm. The at least one electronic switch has a touching element. The pressing button is covered on the upper shell. The pressing button has at least one touching board. A bottom surface of the at least one touching board protrudes downward to form at least one pressing block corresponding to the at least one electronic switch. The at least one pressing block is shown as a hollow shape. A rear of the at least one pressing block is opened freely. The at least one elastic arm is received in the at least one pressing block. A bottom of a free end of the at least one elastic arm abuts against an inner surface of a bottom wall of the at least one pressing block. A bottom surface of the at least one pressing block abuts against one end of the touching element of the at least one electronic switch, so the at least one elastic arm generates a resilience force on the at least one pressing block to make the bottom surface of the at least one pressing block keep abutting against the touching element of the at least one electronic switch.

Another object of the present invention is to provide a mouse. The mouse includes a lower shell, an upper shell, a circuit board and a pressing button. The upper shell is covered on the lower shell. The upper shell is spaced from the lower shell to form an accommodating space between the lower shell and the upper shell. A front end of a top surface of the upper shell is recessed inward towards an inside of the upper shell to form a receiving groove. At least one portion of a bottom wall of the receiving groove defines at least one pressing hole penetrating downward through the bottom wall of the receiving groove. The at least one pressing hole is communicated with the accommodating space. One end of the at least one pressing hole meanders towards the other end of the at least one pressing hole to form at least one elastic arm, and a top of the at least one elastic arm protrudes outward. The circuit board is fastened in the accommodating space. A front end of a top surface of the circuit board is equipped with at least one electronic switch corresponding to the at least one elastic arm. The at least one electronic switch has a touching element. The pressing button is covered on the upper shell. The pressing button has at least one touching board fastened in the receiving groove. A bottom surface of the at least one touching board protrudes downward to form at least one pressing block corresponding to the at least one electronic switch. A rear of the at least one pressing block is opened freely. The at least one elastic arm is received in the at least one pressing block. A bottom of a free end of the at least one elastic arm abuts against an inner surface of a bottom wall of the at least one pressing block. A bottom surface of the at least one pressing block abuts against one end of the touching element of the at least one electronic switch.

Another object of the present invention is to provide a mouse. The mouse includes a lower shell, an upper shell, a circuit board, a pressing button and a rear cover. The upper shell is covered on the lower shell. The upper shell is spaced from the lower shell to form an accommodating space between the lower shell and the upper shell. A front end of a top surface of the upper shell is recessed inward towards an inside of the upper shell to form a receiving groove. At least one portion of a bottom wall of the receiving groove defines at least one pressing hole penetrating downward through the bottom wall of the receiving groove. The at least one pressing hole is communicated with the accommodating space. One end of the at least one pressing hole meanders towards the other end of the at least one pressing hole to form at least one elastic arm, and a top of the at least one elastic arm protrudes outward. The circuit board is fastened in the accommodating space. A front end of a top surface of the circuit board is equipped with at least one electronic switch corresponding to the at least one elastic arm. The at least one electronic switch has a touching element and an elastic element. A bottom end of the touching element is located on and abuts against a top of the elastic element. The pressing button is covered on the upper shell. The pressing button has at least one touching board fastened in the receiving groove. A bottom surface of the at least one touching board protrudes downward to form at least one pressing block corresponding to the at least one electronic switch. A rear of the at least one pressing block is opened freely. The at least one elastic arm is received in the at least one pressing block. A bottom of a free end of the at least one elastic arm abuts against an inner surface of a bottom wall of the at least one pressing block. A bottom surface of the at least one pressing block abuts against a top end of the touching element of the at least one electronic switch. The rear cover is covered to rears of the lower shell and the upper shell.

As described above, the at least one elastic arm is received in the at least one pressing block, the bottom of the free end of the elastic arm abuts against the inner surface of the bottom wall of the at least one pressing block, the bottom surface of the at least one pressing block contacts with and abuts against the top end of the touching element of the at least one electronic switch, the bottom end of touching element of the at least one electronic switch abuts against the elastic element to generate an external force, when the external force from the touching element of the at least one electronic switch is acted on the at least one pressing block of the pressing button and the at least one elastic arm, the at least one elastic arm generates an elastic deformation and generates a resilience force to make the touching element of the at least one electronic switch abut against the bottom surface of the at least one pressing block of the pressing button and be without triggering the touching element of the at least one electronic switch until the pressing button is pressed downward, when the pressing button is pressed downward, the at least one pressing block of the pressing button is pressed downward on the touching element of the at least one electronic switch to start the touching element of the at least one electronic switch, even if the touching element of the at least one electronic switch and the at least one pressing block of the pressing button are interacted and contacted in a long time to generate a partial abrasion phenomenon, an idle stroke problem will be without being caused and the touching element of the at least one electronic switch and the at least one pressing block of the pressing button still keep being contacted with each other. As a result, the mouse has no need of being equipped with an extra key, and the mouse still has a better hand feeling after being used in the long time.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
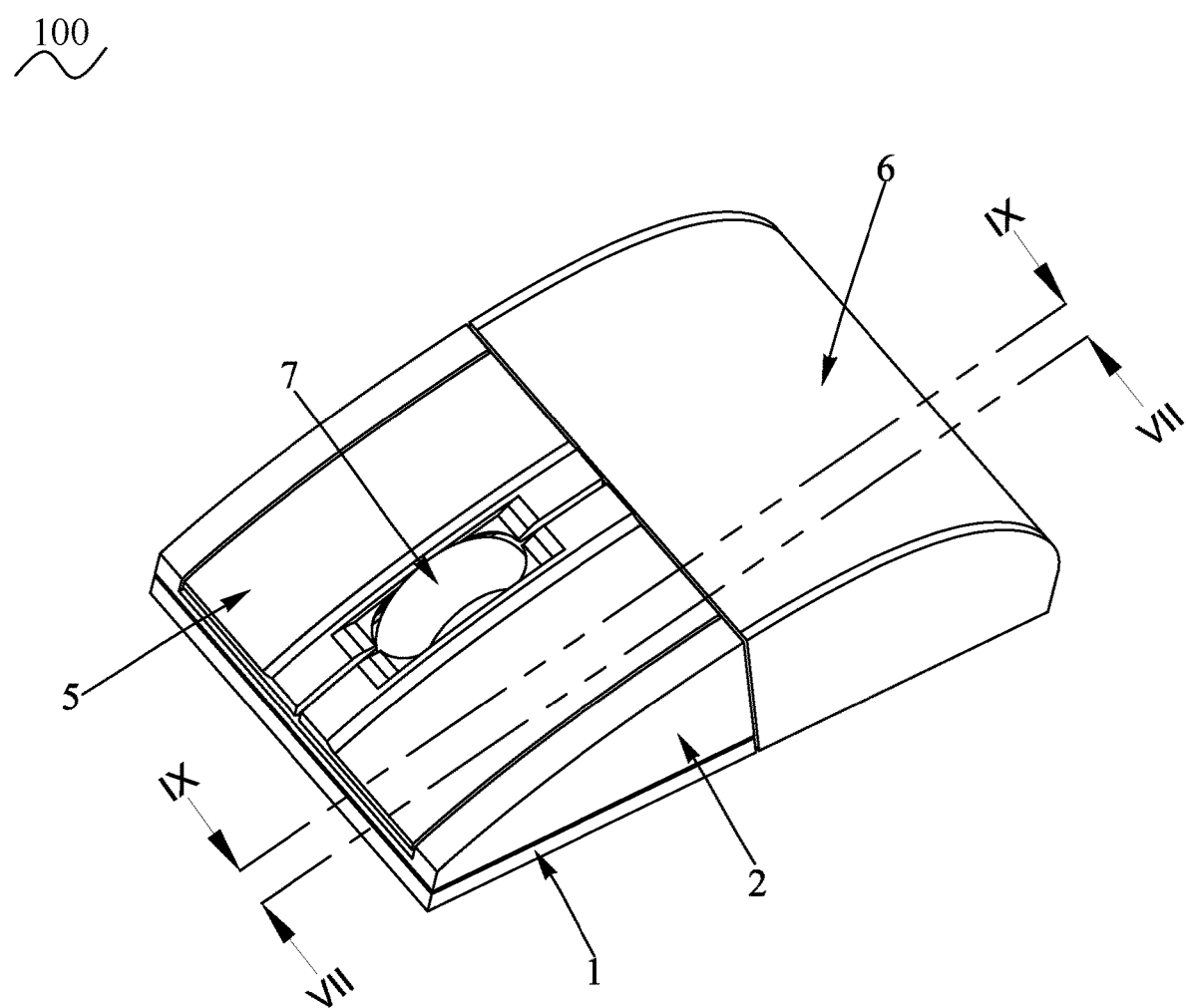
FIG. 1 is a perspective view of a mouse in accordance with a preferred embodiment of the present invention.

With reference to FIG. 1 to FIG. 4, a mouse 100 in accordance with a preferred embodiment of the present invention is shown. The mouse 100 includes a lower shell 1, an upper shell 2, a circuit board 3, at least one electronic switch 4, a pressing button 5, a rear cover 6 and a wheel button 7.

The circuit board 3 is positioned on a top surface of a middle of the lower shell 1. A front end of a top surface of the circuit board 3 is equipped with the at least one electronic switch 4. The upper shell 2 is covered on the lower shell 1. In the preferred embodiment, the mouse 100 includes two electronic switches 4. The two electronic switches 4 are mounted on two opposite sides of the front end of the top surface of the circuit board 3 and aligned with each other. The pressing button 5 is covered on the upper shell 2. The rear cover 6 is covered to rears of the lower shell 1 and the upper shell 2. The wheel button 7 is assembled in the lower shell 1 and the upper shell 2. The wheel button 7 is partially exposed out of a top surface of the pressing button 5.

Referring to FIG. 1, FIG. 2, FIG. 3, FIG. 9 and FIG. 10, the upper shell 2 is shown as a hollow shape with a top of the upper shell 2 being arched upward and a bottom of the upper shell 2 being opened freely. A middle of the upper shell 2 is spaced from the lower shell 1 to form an accommodating space 11 between the lower shell 1 and the upper shell 2. The circuit board 3 is fastened in the accommodating space 11. The upper shell 2 has a receiving groove 21, at least one pressing hole 22, a fastening groove 23, at least one elastic arm 24, at least one fastening block 25 and a first locating hole 26. The at least one electronic switch 4 is corresponding to the at least one elastic arm 24. A front end of a top surface of the upper shell 2 is recessed inward towards an inside of the upper shell 2 to form the receiving groove 21. A front end of the pressing button 5 is received in the receiving groove 21. At least one portion of a bottom wall of the receiving groove 21 defines at least one pressing hole 22 penetrating downward through the bottom wall of the receiving groove 21 and communicated with the inside of the upper shell 2. The at least one pressing hole 22 is communicated with the accommodating space 11.

In the preferred embodiment, two opposite sides of the bottom wall of the receiving groove 21 define two pressing holes 22 penetrating downward through the bottom wall of the receiving groove 21 and communicated with the inside of the upper shell 2. The two pressing holes 22 are communicated with the accommodating space 11. The two pressing holes 22 are arranged transversely.

A middle of the top surface of the upper shell 2 is recessed inward towards the inside of the upper shell 2 to form the fastening groove 23 communicated with the receiving groove 21. At least one portion of a rear end of the bottom wall of the fastening groove 23 defines the at least one fixing hole 231 penetrating downward through the bottom wall of the fastening groove 23 and communicated with the inside of the upper shell 2. The at least one fixing hole 231 is communicated with the accommodating space 11. Two sides of the rear end of the bottom wall of the fastening groove 23 define two fixing holes 231 penetrating through the bottom wall of the fastening groove 23 and communicated with the inside of the upper shell 2. The two fixing holes 231 are communicated with the accommodating space 11.

A rear end of the pressing button 5 is received in the fastening groove 23. One end of the at least one pressing hole 22 meanders towards the other end of the at least one pressing hole 22 to form the at least one elastic arm 24, and a top of the at least one elastic arm 24 protrudes outward. When the at least one elastic arm 24 is assembled to a corresponding mechanism of the pressing button 5, the at least one elastic arm 24 has a partial dimension interference. In the preferred embodiment, the upper shell 2 has two elastic arms 24. One end of one pressing hole 22 meanders towards the other end of the one pressing hole 22 to form one elastic arm 24, and a top of the one elastic arm 24 protrudes outward. One end of the other pressing hole 22 meanders towards the other end of the other pressing hole 22 to form the other elastic arm 24, and a top of the other elastic arm 24 protrudes outward.

The at least one electronic switch 4 has a touching element 41, an elastic element 42, at least two terminals 43, an upper cover 44 and a lower cover 45. When an external force from the touching element 41 of the at least one electronic switch 4 is acted on the corresponding mechanism of the pressing button 5 and the at least one elastic arm 24, the at least one elastic arm 24 generates an elastic deformation and generates a resilience force, the resilience force of the at least one elastic arm 24 makes a bottom surface of the corresponding mechanism of the pressing button 5 abut against the at least one electronic switch 4 and be without triggering a corresponding structure of the at least one electronic switch 4 until the pressing button 5 is pressed downward. When the pressing button 5 is pressed downward, the corresponding mechanism of the pressing button 5 is pressed downward to start the corresponding structure of the at least one electronic switch 4. An inner surface of an outer side of the at least one fixing hole 231 extends downward to form the at least one fastening block 25.

In the preferred embodiment, the upper shell 2 has two fastening blocks 25. Inner surfaces of two outer side walls of the two fixing holes 231 extend downward to form the two fastening blocks 25. Each fastening block 25 is used for buckling with at least one hooking portion 54 of the pressing button 5 to realize locating and fixing the upper shell 2 with the pressing button 5. A middle of the bottom wall of the receiving groove 21 defines the first locating hole 26 located between the two pressing holes 22. The wheel button 7 is mounted to a position of the first locating hole 26.

Referring to FIG. 2 to FIG. 10, the two electronic switches 4 mounted on the two opposite sides of the front end of the top surface of the circuit board 3 are arranged transversely. Each electronic switch 4 has the touching element 41, the elastic element 42, the at least two terminals 43, the upper cover 44 and the lower cover 45. The touching element 41 is partially exposed to a top surface of the upper cover 44. A bottom end of the touching element 41 of the at least one electronic switch 4 is located on and abuts against a top of the elastic element 42 to generate the external force. When a top end of touching element 41 of the at least one electronic switch 4 abuts against a bottom surface of at least one pressing block 55 of the pressing button 5 to push the at least one elastic arm 24 to make the at least one elastic arm 24 deformed, the external force from the touching element 41 of the at least one electronic switch 4 is acted on the at least one pressing block 55 of the pressing button 5 and the at least one elastic arm 24, so the at least one elastic arm 24 generates the elastic deformation and generates the resilience force on the at least one pressing block 55 to make the bottom surface of the at least one pressing block 55 of the pressing button 5 keep abutting against the touching element 41 of the at least one electronic switch 4 and be without triggering the touching element 41 of the at least one electronic switch 4 until the pressing button 5 is pressed downward.

When the pressing button 5 is pressed downward, the at least one pressing block 55 of the pressing button 5 is pressed downward on the touching element 41 of the at least one electronic switch 4 to start the touching element 41 of the at least one electronic switch 4, even if the touching element 41 of the at least one electronic switch 4 and the at least one pressing block 55 of the pressing button 5 are interacted and contacted in a long time to generate a partial abrasion phenomenon, an idle stroke problem will be without being caused and the touching element 41 of the at least one electronic switch 4 and the at least one pressing block 55 of the pressing button 5 still keep being contacted with each other. The elastic element 42 is mounted above the lower cover 45. The upper cover 44 is covered on the lower cover 45. The elastic element 42 is located between the upper cover 44 and the lower cover 45. The at least two terminals 43 pass through the lower cover 45 of the at least one electronic switch 4. Bottom ends of the at least two terminals 43 are fastened to the circuit board 3. The at least one electronic switch 4 is fastened to the circuit board 3 by the at least two terminals 43.

In the preferred embodiment, the at least one electronic switch 4 includes two terminals 43. The two terminals 43 are mounted in the lower cover 45 and upper ends of the two terminals 43 project beyond a top surface of the lower cover 45. The upper end of one terminal 43 is located above and faces to the upper end of the other terminal 43. The elastic element 42 is clamped between the upper ends of the two terminals 43. The upper end of the other terminal 43 has two blocking portions 431. One end of the elastic element 42 is punched downward to form a bending slice 421. The one end of the elastic element 42 is clamped between the upper ends of the two terminals 43. The one end of the elastic element 42 defines a first opening 422. The bending slice 421 is extended frontward and is bent downward from a rear end wall of the first opening 422. A front end of the bending slice 421 is spaced from a front end wall of the first opening 422. The other end of the elastic element 42 defines a second opening 423. The two blocking portions 431 pass through a front of the first opening 422 and the second opening 423, and a front end of the bending slice 421 and a front end wall of the second opening 423 are blocked by the two blocking portions 431. Bottom ends of the two terminals 43 are fastened to the circuit board 3. The at least one electronic switch 4 is fastened on the circuit board 3 by the two terminals 43.

Referring to FIG. 1 to FIG. 10, the pressing button 5 has at least one cantilever arm 51 formed at a rear end of the pressing button 5, a fastening board 52, at least one touching board 53 formed at a front end of the pressing button 5, the at least one hooking portion 54, the at least one pressing block 55 and a second locating hole 56. A middle of the at least one touching board 53 defines the second locating hole 56 penetrating through the middle of the at least one touching board 53 and corresponding to the first locating hole 26. The wheel button 7 is partially received in the first locating hole 26 and the second locating hole 56, and the wheel button 7 partially projects beyond a top surface of the at least one touching board 53. The at least one cantilever arm 51 is slantwise extended rearward and upward from a front end of the fastening board 52, and the at least one cantilever arm 51 is connected with the front end of the fastening board 52. A free end of the at least one cantilever arm 51 expands outward, and slantwise extends frontward and downward to form the at least one touching board 53 slightly arched outward. A rear end of the at least one cantilever arm 51 is connected with the fastening board 52. The fastening board 52 is fastened in a rear end of the fastening groove 23. The at least one touching board 53 is fastened in the receiving groove 21. The at least one cantilever arm 51 is fastened in a front end of the fastening groove 23.

In the preferred embodiment, two ends of a front of the fastening board 52 slantwise extend frontward and downward to form two cantilever arms 51. Free ends of the two cantilever arms 51 expand outward, and slantwise extend frontward and downward to form two touching boards 53 slightly arched outward. The two touching boards 53 are corresponding to and combined with each other. The two cantilever arms 51 are fastened in the front end of the fastening groove 23. The two touching boards 53 are received in the receiving groove 21 and are arranged transversely.

A bottom surface of the at least one touching board 53 protrudes downward to form the at least one pressing block 55 corresponding to the at least one electronic switch 4. The at least one pressing block 55 is shown as a hollow shape. A rear of the at least one pressing block 55 is opened freely. The at least one pressing block 55 is received in the at least one pressing hole 22. The at least one elastic arm 24 is received in the at least one pressing block 55. A bottom of a free end of the at least one elastic arm 24 abuts against an inner surface of a bottom wall of the at least one pressing block 55. The bottom surface of the at least one pressing block 55 contacts with and abuts against one end of the touching element 41 of the at least one electronic switch 4. The bottom surface of the at least one pressing block 55 contacts with and abuts against the top end of the touching element 41 of the at least one electronic switch 4. The at least one elastic arm 24 is integrated with the upper shell 2 by a plastic insert molding technology. The at least one elastic arm 24 is shown as a S shape from a side view. A front end of the at least one elastic arm 24 is arched downward. One end of the at least one elastic arm 24 is connected with the upper shell 2, and the other end of the at least one elastic arm 24 abuts against the inner surface of the bottom wall of the at least one pressing block 55. A bottom surface of the front end of the at least one elastic arm 24 abuts against the inner surface of the bottom wall of the at least one pressing block 55. A tail end of the at least one elastic arm 24 is exposed out of the at least one pressing block 55.

In the preferred embodiment, bottom surfaces of the two touching boards 53 protrude downward to form the two pressing blocks 55 corresponding to the two electronic switches 4. The two pressing blocks 55 are shown as the hollow shapes. Rears of the two pressing blocks 55 are opened freely. The two pressing blocks 55 are received in the two pressing holes 22. The two elastic arms 24 are received in the two pressing blocks 55. Bottoms of two free ends of the two elastic arms 24 abut against inner surfaces of two bottom walls of the two pressing blocks 55. Two bottom surfaces of the two pressing blocks 55 contact with and abut against two top ends of the two touching elements 41 of the two electronic switches 4. In this case, each elastic arm 24 is integrated with the upper shell 2 by the plastic insert molding technology. Each elastic arm 24 is shown as the S shape from a side view. A front end of each elastic arm 24 is arched downward. One end of each elastic arm 24 is connected with the upper shell 2, and the other end of each elastic arm 24 abuts against the inner surface of the bottom wall of one pressing block 55. A bottom surface of the front end of each elastic arm 24 abuts against the inner surface of the bottom wall of the one pressing block 55. A tail end of each elastic arm 24 is exposed out of the one pressing block 55.

At least one portion of a bottom surface of the fastening board 52 extends downward to form at least one hooking portion 54. The at least one hooking portion 54 hooks and is buckled with the at least one fastening block 25. Two sides of a bottom surface of the fastening board 52 extend downward to form two hooking portions 54. Each hooking portion 54 is used for being buckled with one fastening block 25 of the upper shell 2 to realize locating and fixing the pressing button 5 with the upper shell 2. The two hooking portions 54 hook and are buckled with the two fastening blocks 25. Two adjacent sides of the two touching boards 53 define the second locating hole 56 corresponding to a position of the first locating hole 26. The wheel button 7 is partially received in the first locating hole 26 and the second locating hole 56, and the wheel button 7 partially projects beyond top surfaces of the two touching boards 53.

Figure 2:
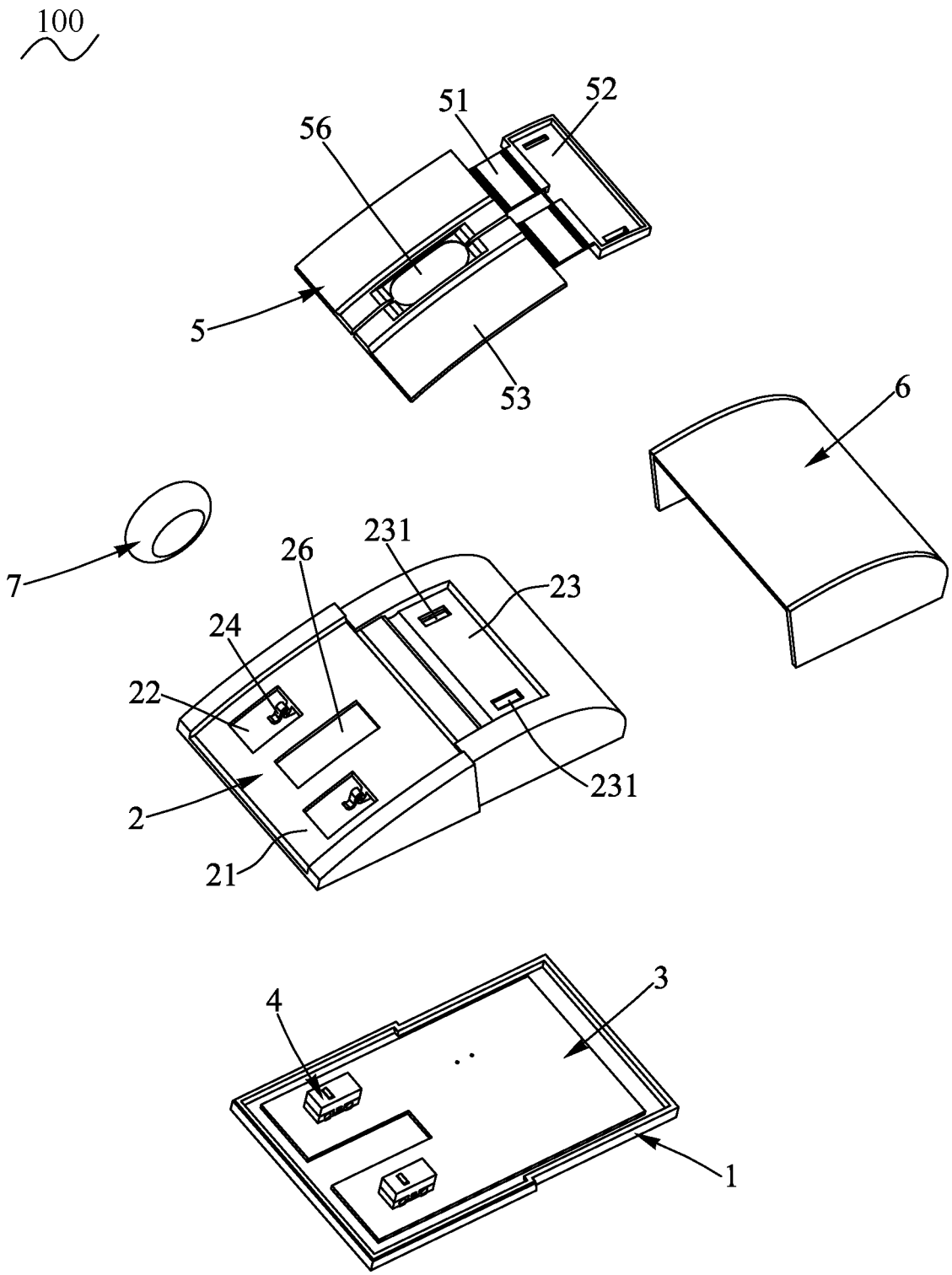
FIG. 2 is an exploded view of the mouse of FIG. 1.
Figure 3:
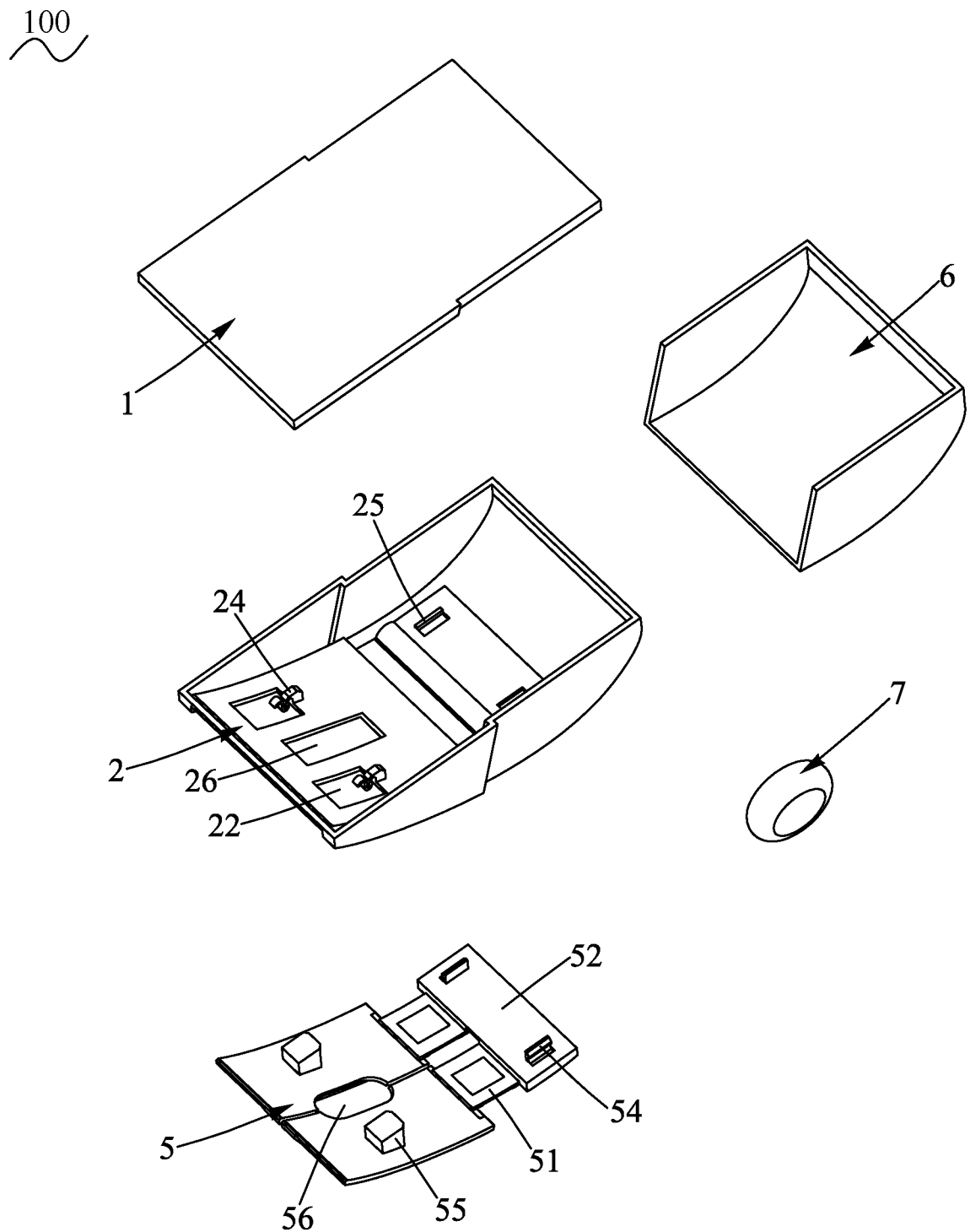
FIG. 3 is another exploded view of the mouse of FIG. 1.
Figure 4:
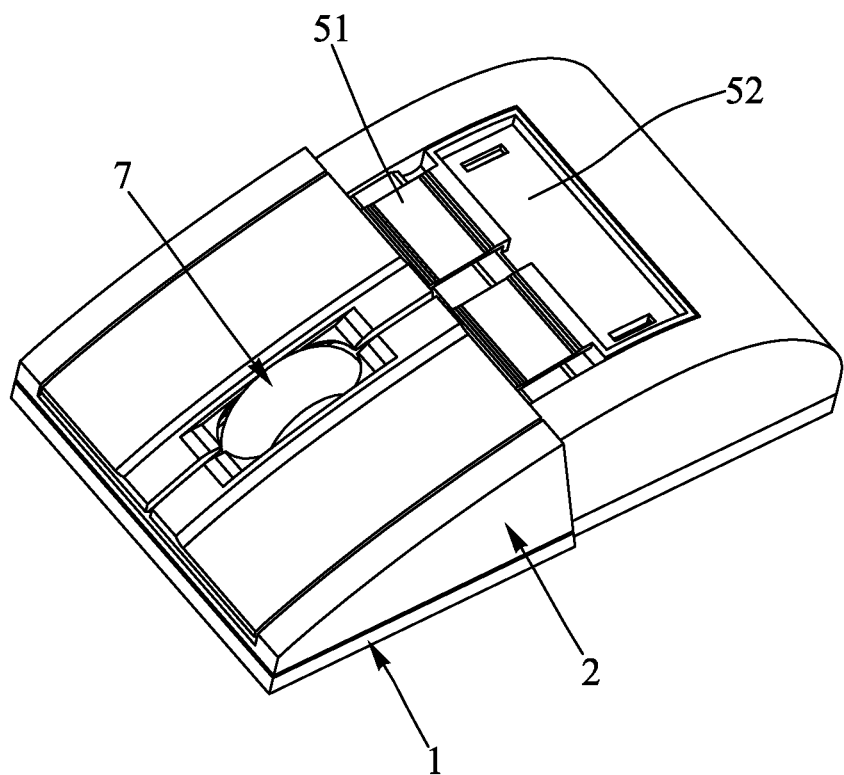
FIG. 4 is a partially perspective view of the of the mouse of FIG. 1, wherein a rear cover is omitted.
Figure 5:
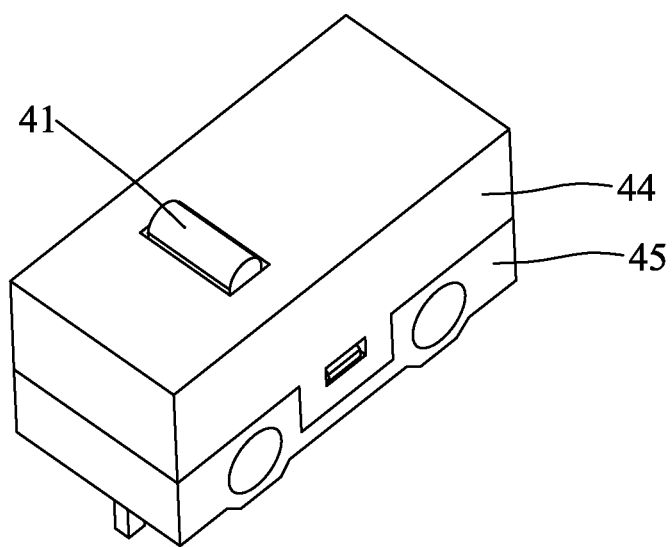
FIG. 5 is a perspective view of an electronic switch of the mouse of FIG. 1.
Figure 6:
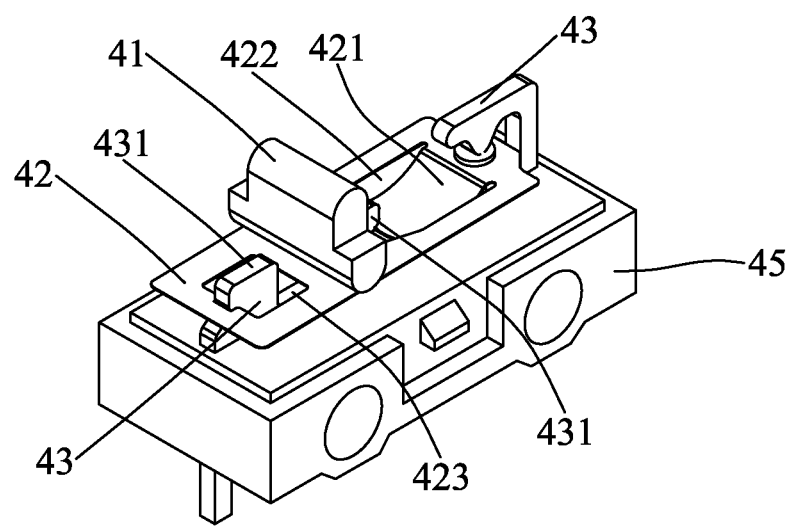
FIG. 6 is a partially perspective view of the electronic switch of the mouse of FIG. 1.
Figure 7:
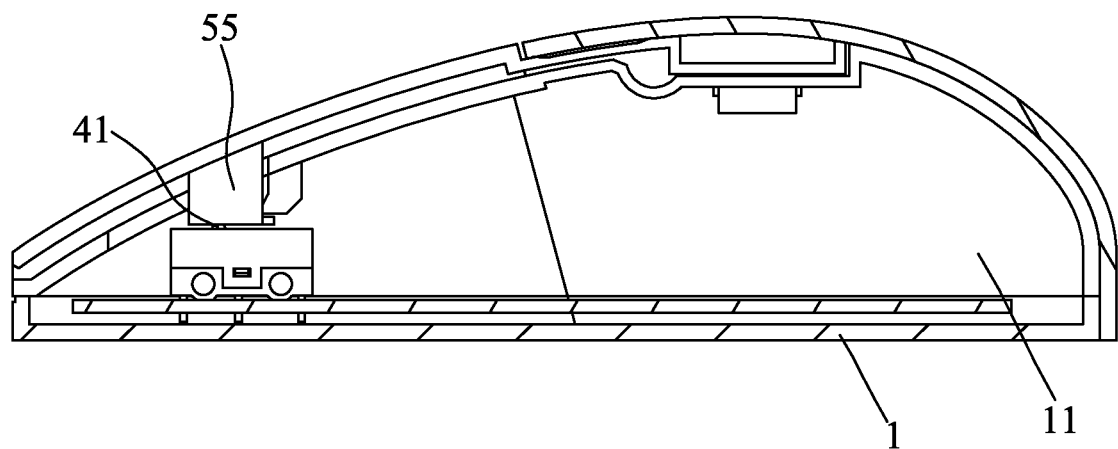
FIG. 7 is a sectional view of the mouse along a line VII-VII of FIG. 1, wherein a pressing block of a pressing button abuts against a touching element of the mouse of FIG. 1.
Figure 8:
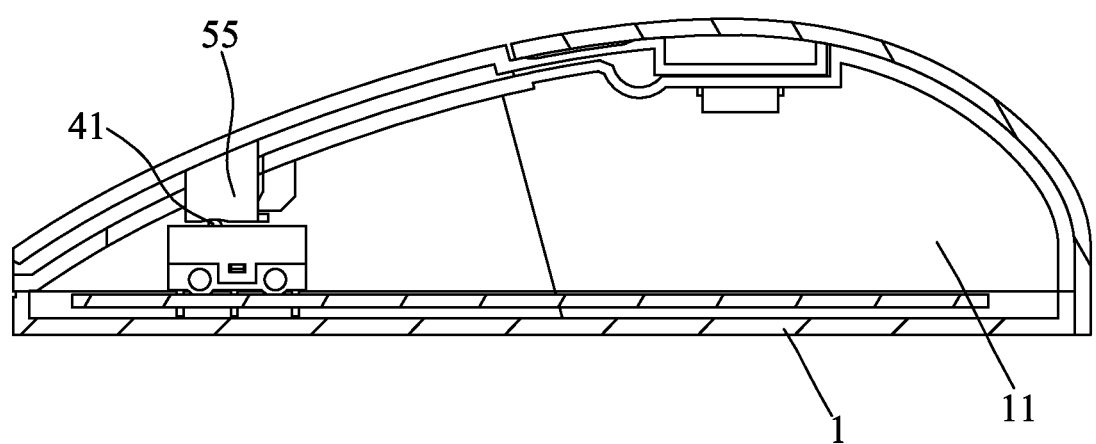
FIG. 8 is a diagrammatic drawing showing that the abraded pressing block of the pressing button abuts against the touching element of the mouse of FIG. 7.
Figure 9:
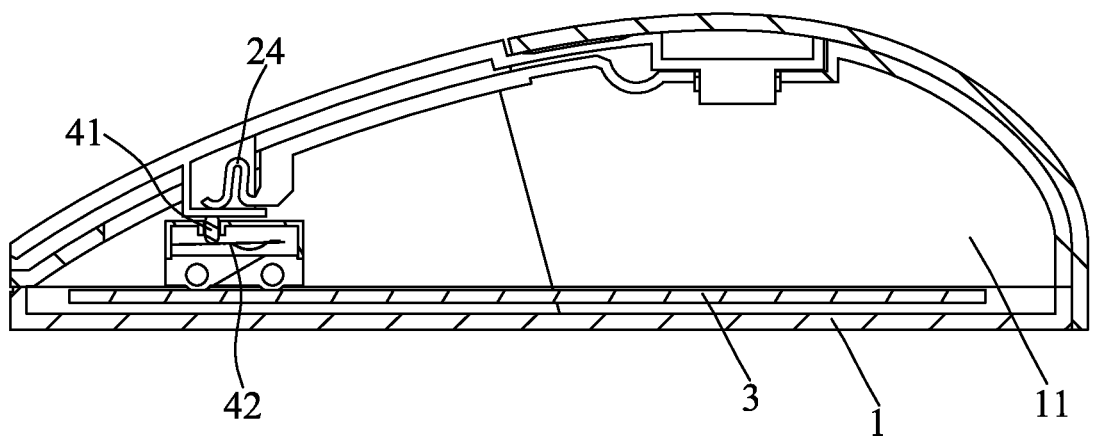
FIG. 9 is a sectional view of the mouse along a line IX-IX of FIG. 1, wherein an elastic arm abuts against the pressing block of the pressing button of the mouse of FIG. 1.
Figure 10:
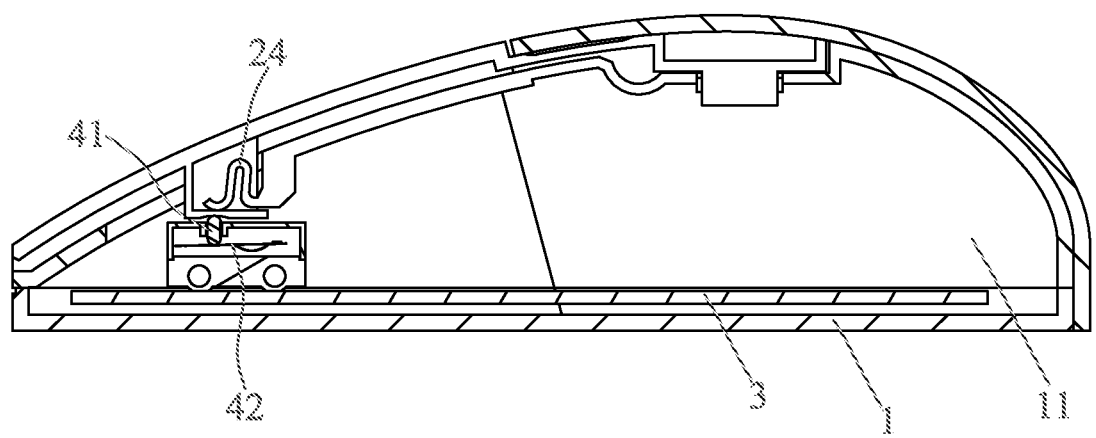
FIG. 10 is a diagrammatic drawing showing that the elastic arm abuts against the abraded pressing block of the pressing button of the mouse of FIG. 9.

Referring to FIG. 1 and FIG. 2, the rear cover 6 is covered to rears of the lower shell 1 and the upper shell 2, the at least one cantilever arm 51 and the fastening board 52 are covered in the rear cover 6.

As described above, the at least one elastic arm 24 is received in the at least one pressing block 55, the bottom of the free end of the elastic arm 24 abuts against the inner surface of the bottom wall of the at least one pressing block 55, the bottom surface of the at least one pressing block 55 contacts with the top end of the touching element 41 of the at least one electronic switch 4, the bottom end of touching element 41 of the at least one electronic switch 4 abuts against the elastic element 42 to generate the external force, when the external force from the touching element 41 of the at least one electronic switch 4 is acted on the at least one pressing block 55 of the pressing button 5 and the at least one elastic arm 24, the at least one elastic arm 24 generates the elastic deformation and generates the resilience force to make the touching element 41 of the at least one electronic switch 4 abut against the bottom surface of the at least one pressing block 55 of the pressing button 5 and be without triggering the touching element 41 of the at least one electronic switch 4 until the pressing button 5 is pressed downward, when the pressing button 5 is pressed downward, the at least one pressing block 55 of the pressing button 5 is pressed downward on the touching element 41 of the at least one electronic switch 4 to start the touching element 41 of the at least one electronic switch 4, even if the touching element 41 of the at least one electronic switch 4 and the at least one pressing block 55 of the pressing button 5 are interacted and contacted in the long time to generate the partial abrasion phenomenon, the idle stroke problem will be without being caused and the touching element 41 of the at least one electronic switch 4 and the at least one pressing block 55 of the pressing button 5 still keep being contacted with each other. As a result, the mouse 100 has no need of being equipped with an extra key, and the mouse 100 still has a better hand feeling after being used in the long time.

What is claimed is:
1. A mouse, comprising:
a lower shell;
an upper shell covered on the lower shell, a middle of the upper shell being spaced from the lower shell to form an accommodating space between the lower shell and the upper shell, the upper shell having at least one elastic arm;

a circuit board fastened in the accommodating space, a front end of a top surface of the circuit board being equipped with at least one electronic switch, the at least one electronic switch being corresponding to the at least one elastic arm, the at least one electronic switch having a touching element; and a pressing button covered on the upper shell, the pressing button having at least one touching board, a bottom surface of the at least one touching board protruding downward to form at least one pressing block corresponding to the at least one electronic switch, the at least one pressing block being shown as a hollow shape, a rear of the at least one pressing block being opened freely, the at least one elastic arm being received in the at least one pressing block, a bottom of a free end of the at least one elastic arm abutting against an inner surface of a bottom wall of the at least one pressing block, a bottom surface of the at least one pressing block abutting against one end of the touching element of the at least one electronic switch, so the at least one elastic arm generating a resilience force on the at least one pressing block to make the bottom surface of the at least one pressing block keep abutting against the touching element of the at least one electronic switch;

wherein a front end of a top surface of the upper shell is recessed inward towards an inside of the upper shell to form a receiving groove, at least one portion of a bottom wall of the receiving groove defines at least one pressing hole penetrating downward through the bottom wall of the receiving groove, and one end of the at least one pressing hole meanders towards the other end of the at least one pressing hole to form the at least one elastic arm, and a top of the at least one elastic arm protrudes outward.

2. The mouse as claimed in claim 1, wherein the bottom surface of the at least one pressing block contacts with and abuts against a top end of the touching element of the at least one electronic switch.

3. The mouse as claimed in claim 1, wherein the at least one electronic switch has an elastic element, an upper cover and a lower cover, the touching element is partially exposed to a top surface of the upper cover, a bottom end of the touching element of the at least one electronic switch abuts against the elastic element to generate an external force, when a top end of touching element of the at least one electronic switch abuts against the bottom surface of the at least one pressing block of the pressing button to push the at least one elastic arm to make the at least one elastic arm deformed, so that the at least one elastic arm generates the resilience force to make the bottom surface of the at least one pressing block abut against the touching element of the at least one electronic switch and be without triggering the touching element of the at least one electronic switch until the pressing button is pressed downward, the elastic element is located between the upper cover and the lower cover.

4. The mouse as claimed in claim 3, wherein the at least one electronic switch has at least two terminals, the at least two terminals pass through the lower cover of the at least one electronic switch, bottom ends of the at least two terminals are fastened to the circuit board, the at least one electronic switch is fastened to the circuit board by the at least two terminals.

5. The mouse as claimed in claim 1, wherein the at least one pressing hole is communicated with the accommodating space, a middle of the top surface of the upper shell is recessed inward towards the inside of the upper shell to form a fastening groove communicated with the receiving groove.

6. The mouse as claimed in claim 5, wherein the pressing button has a fastening board, at least one portion of a rear end of a bottom wall of the fastening groove defines at least one fixing hole penetrating downward through the bottom wall of the fastening groove, the at least one fixing hole is communicated with the accommodating space, an inner surface of an outer side of the at least one fixing hole extends downward to form at least one fastening block, at least one portion of a bottom surface of the fastening board extends downward to form at least one hooking portion, the at least one hooking portion hooks and is buckled with the at least one fastening block.

7. The mouse as claimed in claim 5, wherein the pressing button has a fastening board, two sides of a rear end of a bottom wall of the fastening groove define two fixing holes penetrating through the bottom wall of the fastening groove, the two fixing holes are communicated with the accommodating space, inner surfaces of two outer side walls of the two fixing holes extend downward to form two fastening blocks, two sides of a bottom surface of the fastening board extend downward to form two hooking portions, the two hooking portions hook and are buckled with the two fastening blocks.

8. The mouse as claimed in claim 5, wherein two opposite sides of the bottom wall of the receiving groove define two pressing holes penetrating downward through the bottom wall of the receiving groove, the two pressing holes are communicated with the accommodating space, the two pressing holes are arranged transversely, a middle of the bottom wall of the receiving groove defines a first locating hole located between the two pressing holes.

9. The mouse as claimed in claim 8, wherein a middle of the at least one touching board defines a second locating hole penetrating through the middle of the at least one touching board and corresponding to the first locating hole, the mouse further includes a wheel button, the wheel button is partially received in the first locating hole and the second locating hole, and the wheel button partially projects beyond a top surface of the at least one touching board.

10. The mouse as claimed in claim 8, wherein the upper shell has two elastic arms, one end of one pressing hole meanders towards the other end of the one pressing hole to form one elastic arm, and a top of the one elastic arm protrudes outward, one end of the other pressing hole meanders towards the other end of the other pressing hole to form the other elastic arm, and a top of the other elastic arm protrudes outward, the mouse includes two electronic switches, the two electronic switches are mounted on two opposite sides of the front end of the top surface of the circuit board and aligned with each other, the pressing button has a fastening board, two ends of a front of the fastening board slantwise extend frontward and downward to form two cantilever arms, free ends of the two cantilever arms expand outward, and slantwise extend frontward and downward to form two touching boards slightly arched outward, bottom surfaces of the two touching boards protrude downward to form two pressing blocks corresponding to the two electronic switches, the two pressing blocks are shown as the hollow shapes, rears of the two pressing blocks are opened freely, the two pressing blocks are received in the two pressing holes, the two elastic arms are received in the two pressing blocks, bottoms of two free ends of the two elastic arms abut against inner surfaces of two bottom walls of the two pressing blocks.

11. The mouse as claimed in claim 10, wherein two bottom surfaces of the two pressing blocks contact with and abut against two tops of two touching elements of the two electronic switches, the two cantilever arms are fastened in a front end of the fastening groove, the two touching boards are received in the receiving groove and are arranged transversely.

12. The mouse as claimed in claim 10, wherein the two touching boards are corresponding to and combined with each other, two adjacent sides of the two touching boards define a second locating hole corresponding to a position of the first locating hole, the mouse includes a wheel button partially received in the first locating hole and the second locating hole, and the wheel button partially projects beyond top surfaces of the two touching boards.

13. The mouse as claimed in claim 5, wherein the pressing button has a fastening board, at least one cantilever arm slantwise extended rearward and upward from a front end of the fastening board, and the at least one touching board formed at a front end of the pressing button, a rear end of the at least one cantilever arm is connected with the fastening board, the at least one cantilever arm is fastened in a front end of the fastening groove, the fastening board is fastened in a rear end of the fastening groove, a free end of the at least one cantilever arm expands outward, and slantwise extends frontward and downward to form the at least one touching board slightly arched outward, the at least one touching board is fastened in the receiving groove.

14. The mouse as claimed in claim 13, further comprising a rear cover covered to rears of the lower shell and the upper shell, the at least one cantilever arm and the fastening board being covered in the rear cover.

15. The mouse as claimed in claim 1, wherein the at least one elastic arm is integrated with the upper shell by a plastic insert molding technology, the at least one elastic arm is shown as a S shape from a side view, a front end of the at least one elastic arm is arched downward, one end of the at least one elastic arm is connected with the upper shell, and the other end of the at least one elastic arm abuts against the inner surface of the bottom wall of the at least one pressing block, a bottom surface of the front end of the at least one elastic arm abuts against the inner surface of the bottom wall of the at least one pressing block, a tail end of the at least one elastic arm is exposed out of the at least one pressing block.

16. A mouse, comprising:
a lower shell;
an upper shell covered on the lower shell, the upper shell being spaced from the lower shell to form an accommodating space between the lower shell and the upper shell, a front end of a top surface of the upper shell being recessed inward towards an inside of the upper shell to form a receiving groove, at least one portion of a bottom wall of the receiving groove defining at least one pressing hole penetrating downward through the bottom wall of the receiving groove, the at least one pressing hole being communicated with the accommodating space, one end of the at least one pressing hole meandering towards the other end of the at least one pressing hole to form at least one elastic arm, and a top of the at least one elastic arm protruding outward;
a circuit board fastened in the accommodating space, a front end of a top surface of the circuit board being equipped with at least one electronic switch corresponding to the at least one elastic arm, the at least one electronic switch having a touching element; and
a pressing button covered on the upper shell, the pressing button having at least one touching board fastened in the receiving groove, a bottom surface of the at least one touching board protruding downward to form at least one pressing block corresponding to the at least one electronic switch, a rear of the at least one pressing block being opened freely, the at least one elastic arm being received in the at least one pressing block, a bottom of a free end of the at least one elastic arm abutting against an inner surface of a bottom wall of the at least one pressing block, a bottom surface of the at least one pressing block abutting against one end of the touching element of the at least one electronic switch.

17. A mouse, comprising:
a lower shell;
an upper shell covered on the lower shell, the upper shell being spaced from the lower shell to form an accommodating space between the lower shell and the upper shell, a front end of a top surface of the upper shell being recessed inward towards an inside of the upper shell to form a receiving groove, at least one portion of a bottom wall of the receiving groove defining at least one pressing hole penetrating downward through the bottom wall of the receiving groove, the at least one pressing hole being communicated with the accommodating space, one end of the at least one pressing hole meandering towards the other end of the at least one pressing hole to form at least one elastic arm, and a top of the at least one elastic arm protruding outward;
a circuit board fastened in the accommodating space, a front end of a top surface of the circuit board being equipped with at least one electronic switch corresponding to the at least one elastic arm, the at least one electronic switch having a touching element and an elastic element, a bottom end of the touching element being located on and abutting against a top of the elastic element;
a pressing button covered on the upper shell, the pressing button having at least one touching board fastened in the receiving groove, a bottom surface of the at least one touching board protruding downward to form at least one pressing block corresponding to the at least one electronic switch, a rear of the at least one pressing block being opened freely, the at least one elastic arm being received in the at least one pressing block, a bottom of a free end of the at least one elastic arm abutting against an inner surface of a bottom wall of the at least one pressing block, a bottom surface of the at least one pressing block abutting against a top end of the touching element of the at least one electronic switch; and
a rear cover covered to rears of the lower shell and the upper shell.

* * * * *